United States Patent
McIlrath

(10) Patent No.: US 8,464,191 B2
(45) Date of Patent: Jun. 11, 2013

(54) SYSTEM AND METHOD FOR IDENTIFYING CIRCUIT COMPONENTS OF AN INTEGRATED CIRCUIT

(75) Inventor: Lisa G. McIlrath, Lexington, MA (US)

(73) Assignee: R3 Logic, Inc., Bedford, MA (US)

( * ) Notice: Subject to any disclaimer, the term of this patent is extended or adjusted under 35 U.S.C. 154(b) by 0 days.

(21) Appl. No.: 13/187,912

(22) Filed: Jul. 21, 2011

(65) Prior Publication Data

US 2013/0024827 A1  Jan. 24, 2013

(51) Int. Cl.
*G06F 9/455* (2006.01)
*G06F 17/50* (2006.01)

(52) U.S. Cl.
USPC .............. 716/107; 716/52; 716/55; 716/111; 716/112; 716/139

(58) Field of Classification Search
USPC ............. 716/50–56, 104, 106–113, 139
See application file for complete search history.

(56) References Cited

U.S. PATENT DOCUMENTS

| | | | |
|---|---|---|---|
| 6,236,746 B1 * | 5/2001 | Chamberlain et al. | 382/145 |
| 6,263,098 B1 * | 7/2001 | Dukes | 382/147 |
| 6,536,018 B1 * | 3/2003 | Chisholm et al. | 716/136 |
| 6,907,583 B2 * | 6/2005 | Abt et al. | 716/110 |
| 7,643,665 B2 * | 1/2010 | Zavadsky et al. | 382/141 |
| 7,937,678 B2 * | 5/2011 | Lippmann et al. | 716/103 |
| 2002/0023107 A1 * | 2/2002 | Gont et al. | 707/504 |
| 2002/0038446 A1 * | 3/2002 | Ioudovski | 716/3 |
| 2005/0278667 A1 * | 12/2005 | Boucher et al. | 716/4 |
| 2006/0045325 A1 * | 3/2006 | Zavadsky et al. | 382/145 |
| 2007/0256037 A1 * | 11/2007 | Zavadsky et al. | 716/2 |
| 2008/0317328 A1 * | 12/2008 | Zavadsky et al. | 382/145 |
| 2009/0092285 A1 * | 4/2009 | Keyes et al. | 382/103 |
| 2009/0313596 A1 * | 12/2009 | Lippmann et al. | 716/12 |
| 2010/0325593 A1 * | 12/2010 | Zavadsky et al. | 716/104 |
| 2011/0041110 A1 * | 2/2011 | Zavadsky et al. | 716/112 |
| 2012/0086432 A1 * | 4/2012 | Noell | 324/96 |

* cited by examiner

*Primary Examiner* — Nha Nguyen
(74) *Attorney, Agent, or Firm* — Seyfarth Shaw LLP; Brian Michaelis

(57) ABSTRACT

A system and method for identifying circuit components of an integrated circuit includes a processor identifying geometric characteristics of an integrated circuit and sorting the geometric characteristics by order of occurrence of each geometric characteristic. Co-occurring arrangements of the geometric characteristics are then identified and used to identify a standard cell. The geometric characteristics of the standard cell may then be compared to the geometric characteristics of a known cell. Each electrically significant geometric characteristic of the standard cell can be compared to the electrically significant geometric characteristics of the known cell. If the standard cell matches the known cell an instance of the standard cell can be placed in a layout. Once placing the standard cell in the layout a netlist can be extracted.

15 Claims, 14 Drawing Sheets

```
nand2_1x x8889  ( .in0( n8230 ), .in1( n1110 ), .y( n8271 ) );
nand2_1x x8888  ( .in0( n8176 ), .in1( n1117 ), .y( n8263 ) );
nor4b0_2x x8887 ( .in0( n15620 ), .in1( n3757 ), .in2( n24241 ), .in3( n653 ), .y( n639 ) );
nor4b0_2x x8886 ( .in0( n23405 ), .in1( n23421 ), .in2( n759 ), .in3( n36931 ), .y( n23486 ) );
nor4b0_2x x8885 ( .in0( n15422 ), .in1( n3475 ), .in2( n15418 ), .in3( n622 ), .y( n15355 ) );
nor4b0_2x x8884 ( .in0( n15079 ), .in1( n15086 ), .in2( n3552 ), .in3( n15068 ), .y( n3587 ) );
nor4b0_2x x8883 ( .in0( n36805 ), .in1( n15075 ), .in2( n15124 ), .in3( n15128 ), .y( n3272 ) );
nor4b0_2x x8882 ( .in0( n10739 ), .in1( n192 ), .in2( n10721 ), .in3( n39004 ), .y( n2023 ) );
```

FIG. 12

SYSTEM AND METHOD FOR IDENTIFYING CIRCUIT COMPONENTS OF AN INTEGRATED CIRCUIT

GOVERNMENT LICENSE RIGHTS

This invention was made with government support under Raytheon Purchase Order 4200251618, Raytheon acting as Prime Contractor under the "Trust In Integrated Circuits Program" awarded by DARPA. The government has certain rights in the invention.

FIELD

The disclosure generally relates to systems and methods for identifying circuit components of an integrated circuit. More specifically, the disclosure relates to systems and methods for identifying circuit components of an integrated circuit through the use of imaging data and graphic database data.

BACKGROUND

In a typical digital design flow of designing an integrated circuit, a VHDL or Verilog behavioral description is synthesized to an equivalent gate-level logical netlist, for example, one containing logic gates (such as, AND2, INV, and NOR2) and their interconnections. Following synthesis, a place-and-route tool will place cells corresponding to the logic gates on a regular grid and will connect the cells' pins with metal lines according to a netlist specification. The cells, which contain the geometric shapes implementing the gate logic at the transistor level, are usually taken from a standard library that has been thoroughly tested and characterized. There are numerous possibilities for modifying or replacing cells once the cells have been instantiated in the physical layout so that it would be difficult for the designer to know if the design has been tampered with.

The design is generally sent to a foundry for fabrication typically using a Graphic Database System II (GDSII) standard file format. Generally, the GDSII format is a database file format for data exchange of integrated circuit (IC) layout artwork. More particularly, the GDSII format is a binary file format representing the geometric shapes comprising the standard cell libraries, along with the metal wiring forming the interconnections. The GDSII file may be "flat" or "hierarchical." An embodiment of an image of a "flat" GDSII file is illustrated in FIG. 1. As illustrated in FIG. 1, the GDSII file may contain only shapes without any library or other cell information. Alternatively, an embodiment of an image of a "hierarchical" GDSII file is illustrated in FIG. 2. As illustrated in FIG. 2, the GDSII file may contain a single copy of the layout for each library cell and provide placement information for instances of each cell in the full design. The different shading properties of FIGS. 1 and 2 correspond to the different physical layers such as polysilicon, contact, first metal, second metal, etc., that are used within the specified foundry process technology.

During fabrication, the shapes in the GDSII file corresponding to each material layer are imprinted on the Silicon wafer via a lithography process. The small size of the features (tens to hundreds of nanometers) compared to the wavelength of light used in the process results in optical distortions that prevent the actual shapes created on the wafer from exactly matching the perfect rectangles and polygons originally drawn. An embodiment of an image of a portion of a first metal layer of a fabricated digital circuit is illustrated in FIG. 3. As illustrated in FIG. 3, the actual shapes created on the wafer are slightly distorted, meaning that the actual shapes are not perfect rectangles and polygons, relative to the shapes as originally drawn in the GDSII file. These distortions may present issues, especially in the context of implementing a process to reverse engineer a fabricated integrated circuit to reveal its original design.

A method of finding locations of standard cells in an integrated circuit is disclosed in U.S. Pat. Nos. 7,643,665; 7,580,557; and 7,873,203 all of which are entitled Method of Design Analysis of Existing Integrated Circuits and issued to Zavadsky et al. (referred to hereinafter as "the '665 patent family"). The '665 patent family discloses a four step process for finding the location of standard cells in an integrated circuit based on images of layers of the integrated circuit. The '665 patent family process is limited to image data and does not take into account other sources of data. More particularly, the '665 patent family process uses distinctive landmarks of the image data, which are pixel amplitude extremes, to obtain points of interest.

According to the '665 patent family process, layers of the integrated circuit are exposed and scanned under high magnification. In the first step of the process, features or points of interest, which are pixel amplitude extremes, of the images are extracted. These pixel amplitude extremes include centers of contacts which are connections between the first conductive layer and the polysilicon layer, vias which are connections between conductive layers, and corners of the polygons representing the lowest conductive layer. Once the points of interest are extracted, the '665 patent family process characterizes each point of interest by building a 32-bit descriptor, which is a grid of 32 non-overlapping rectangles, around each point of interest. If a conductive metal polygon occupies a minimum pre-determined percentage of a rectangle, the rectangle is set to 1; and if no conductive metal polygon occupies the rectangle or it is less than the minimum pre-defined percentage, the rectangle is set to 0. Thus, the '665 patent family process is dependent upon the threshold chosen as the minimum pre-determined percentage for acceptance or non-acceptance. Invariably, there will be situations that are not very clear and in these situations errors may occur.

Further, in the '665 patent family process an operator manually selects the standard cell to be used as the template throughout the comparison process, which can be time consuming and may require the operator to be highly skilled in the area of integrated circuits. More particularly, in the second step of the '665 patent family process, an operator extracts an area of the integrated circuit layout that represents a standard cell, by highlighting or creating a box around a selected area, and indicates that the cell is a standard cell. The standard cell is used as a template and the points of interest in the template are compared to the points of interest within the image.

According to the '665 patent family process, each bit of the 32-bit descriptor of the template point of interest is compared to the corresponding bit of each 32-bit descriptor for each point of interest within the image. Once it has been determined that a point of interest in the image portion is similar to a point of interest on the template, a confidence voting process is conducted. More particularly, the template is superimposed onto portions of the image and the points of interest are compared, wherein votes represent a confidence value of a possible match. Thus, the '665 patent family process is dependent upon the threshold chosen for acceptance or non-acceptance. Invariably, there will be situations that are not very clear and in these situations errors may occur.

In the third and fourth steps, a more rigid comparision of the template to potential matches is performed. In the third step, a coarse filter or match is conducted such as by using image pyramids. In the fourth step, a fine filter or match is performed using a pattern recognition algorithm. More particularly, gray-scale gradients for the template and the possible matches are computed using kernels of different sizes (i.e. n×n pixels). The dot products between the template gradients and the possible match gradients are computed. The results of the dot products undergo morphological dilation and order statistics are performed. If the sums of the order statistics are less than a predefined threshold, the possible match is determined to be a high probability match.

Once a list of the high probability matches has been obtained, the '665 patent family process identifies the input and output (I/O) pins on the high probability matches by mapping the coordinates of the I/O pins of the template to the high probability matches.

While the '665 patent family process uses a comparison scheme appropriate for the quality of image data obtained, among other disadvantages, the '665 patent family process does not incorporate other types and/or sources of data into the process. The '665 patent family process selects the standard cell manually. The '665 patent family process is limited to the imaging of metal layers and does not image non-metal layers such as polysilicon. Further, the '665 patent family process is limited to the identification of a standard cell and does not identify specific functions of the standard cell, such as for example connectivity of the standard cell and a transistor netlist of the integrated circuit.

SUMMARY OF THE INVENTION

The systems and methods disclosed herein relate to identifying circuit components of, or reverse engineering, an integrated circuit into its constituent parts through the use of imaging data and graphic database data. In an illustrative embodiment, a method for identifying circuit components of an integrated circuit includes identifying geometric characteristics of an integrated circuit. A geometric characteristic is any characteristic that can serve as a "fingerprint" for a shape or set of shapes, such as but not limited to contiguous connected components on each conducting layer, an area or perimeter of a shape, bending moments, number of branches, and other morphological invariants. Once the geometric characteristics are identified the geometric characteristics are sorted by the order of occurrence of each geometric characteristic. Co-occurring arrangements of the geometric characteristics are then identified and used to identify a standard cell. The geometric characteristics of the standard cell may then be compared to the geometric characteristics of a known cell, such as a known cell from a catalog or library of predetermined cells. Additionally, each electrically significant geometric characteristic of the standard cell can be compared to the electrically significant geometric characteristics of the known cell. If the standard cell matches the known cell an instance of the standard cell can be placed in the layout. The method may be repeated until all geometries in the layout are replaced with instances of standard cells. Once all geometries in the layout are replaced with instances of standard cells a netlist, such as a gate-level netlist, can be extracted.

In another illustrative embodiment, a system for identifying circuit components of an integrated circuit includes a server computer configured to perform the steps of the method as disclosed herein. The server computer is configured to identify geometric characteristics of an integrated circuit. Once the geometric characteristics are identified the server computer sorts the geometric characteristics by the order of occurrence of each geometric characteristic. The server computer then identifies co-occurring arrangements of the geometric characteristics and identifies a standard cell based on the co-occurring geometric characteristics. The server computer compares the geometric characteristics of the standard cell to the geometric characteristics of a known cell. Each electrically significant geometric characteristic of the standard cell can be compared to the electrically significant geometric characteristics of the known cell. If the standard cell matches the known cell the server computer places an instance of the standard cell in the layout. The server computer may repeat the process until all geometries in the layout are replaced with instances of standard cells. Once all geometries in the layout are replaced with instances of standard cells the server computer can extract a netlist of the layout.

The systems and methods for identifying circuit components of, or reverse engineering, an integrated circuit into its constituent parts disclosed herein provides for automated identification and determination of standard cells based on the identification of the geometric characteristics and inferring common geometry of all matching locations. Additionally, the systems and methods disclosed herein are capable of analyzing multiple layers of the integrated circuit, including all metal and non-metal layers.

BRIEF DESCRIPTION OF THE DRAWINGS

The systems and methods disclosed herein are illustrated in the figures of the accompanying drawings which are meant to be exemplary and not limiting, in which like references are intended to refer to like or corresponding parts, and in which:

FIG. 12 illustrates an exemplary portion of a Verilog gate-level netlist.

DETAILED DESCRIPTION

Detailed embodiments of the systems and methods for identifying circuit components of an integrated circuit are disclosed herein, however, it is to be understood that the disclosed embodiments are merely exemplary of the systems and methods, which may be embodied in various forms. Therefore, specific functional details disclosed herein are not to be interpreted as limiting, but merely as a basis for the claims and as a representative basis for teaching one skilled in the art to variously employ the systems and methods disclosed herein.

Generally, the systems and methods disclosed herein include and may be implemented within a computer system or network of computer systems having one or more databases and other storage apparatuses, servers, and additional components, such as processors, modems, terminals and displays, computer-readable media, algorithms, modules, and other computer-related components. The computer systems are especially configured and adapted to perform the functions and processes of the systems and methods as disclosed herein.

Communications between components in the systems and methods disclosed herein may be bidirectional electronic communication through a wired or wireless configuration or network. For example, one component may be wired or networked directly, indirectly, through a third party intermediary, wirelessly, over the Internet, or otherwise with another component to enable communication between the components.

In an illustrative embodiment, the system for identifying circuit components of an integrated circuit is a computer-based system including a server computer, graphical user interface, a processor, and one or more databases. Illustratively, the server computer, graphical user interface, processor and one or more databases are in bidirectional electronic communication through a wired or wireless network.

Figure 4A:
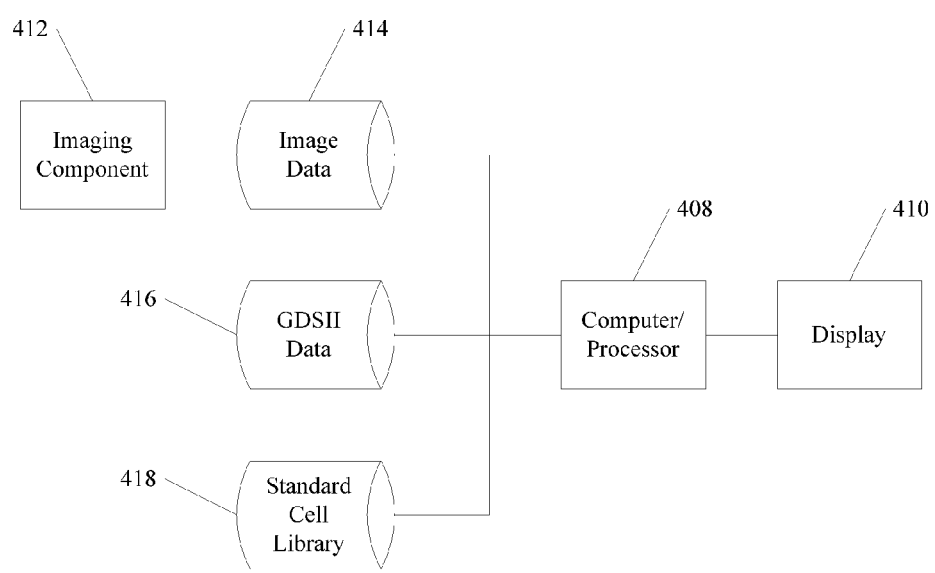
FIG. 4A illustrates an embodiment of a block diagram of a system for identifying circuit components of an integrated circuit.

A flow diagram of a system and method for identifying circuit components of an integrated circuit according to an illustrative embodiment is described with reference to FIGS. 4A and 4B. As illustrated in FIG. 4A, the system includes one or more processors 408, one or more displays 410, an imaging component 412, and one or more databases, such as an imaging data database 414, a GDSII database 416, and a standard cell library database 418. The processor(s) 408 is in communication with the display(s) 410, the imaging data database 414, the GDSII database 416, and the standard cell library database 418. The imaging component 412 is in communication with the imaging data database 414 for storing image data obtained by the imaging component 412, such as a camera-based imaging system or the like.

Figure 4B:
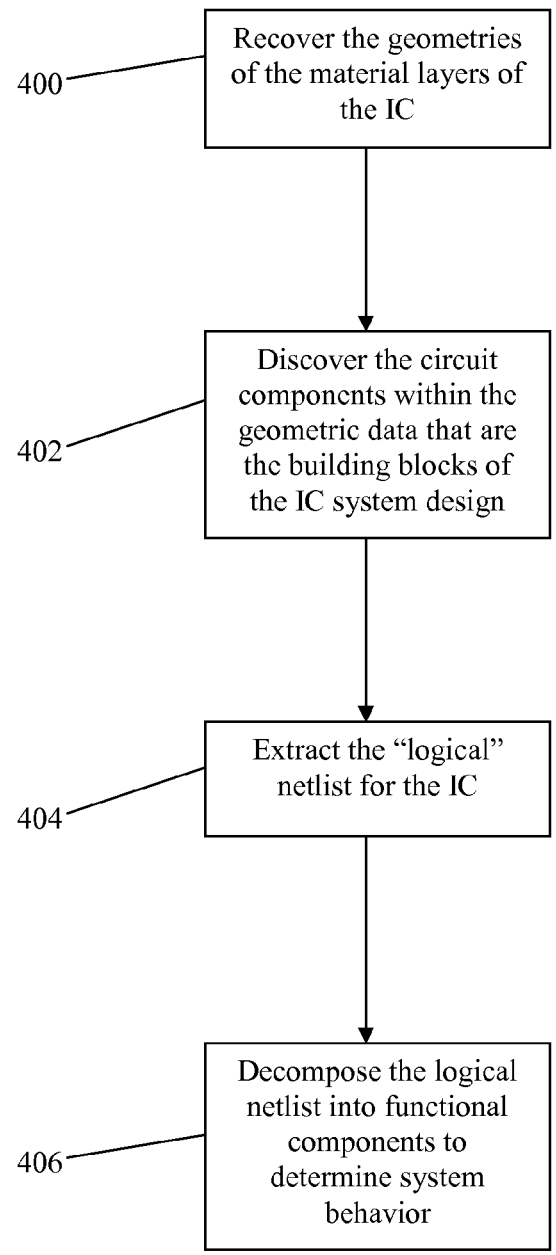
FIG. 4B illustrates an embodiment of a flow diagram of a method for identifying circuit components of an integrated circuit.

Referring to FIGS. 4A and 4B, the process of identifying circuit components of, or reverse engineering, an integrated circuit to reveal its constituent parts or original system design, includes recovering geometries 400 of the material layers that the integrated circuit, or device, is composed of The circuit components within the geometric data that are the building blocks of the integrated circuit are discovered 402, by the processor(s) 408. Then, a "logical" netlist for the integrated circuit can be extracted 404 and decomposed 406 into functional components, by the processor(s) 408, to determine the behavior of the integrated circuit, or system.

In an illustrative embodiment, the geometries of the fabricated material layers are recovered 400 in a format compatible with computer analysis. The geometries of the fabricated material layers can be recovered 400 through a variety of methods involving both destructive and non-destructive imaging techniques, via imaging component 412. In an illustrative embodiment, the geometries of the fabricated material layers are recovered 400 using enhanced digital imaging techniques providing digital image data, which can be stored in the imaging data database 414. Additionally, GDSII data, contained in the GDSII database 416, can be used to recover 400 the geometries of the fabricated material layers.

In an illustrative embodiment, discovering 402 the circuit components of the integrated circuit involves recognizing an unknown library (also referred to herein as "Unknown Library Recognition"). A flow diagram of a method for recognizing an unknown library according to an illustrative embodiment is described with reference to FIG. 5. The process of recognizing an unknown library includes deducing the set of elementary circuit components, or standard cells, from the digital image data and/or GDSII data and identifying their functions, via the processor(s) 408, without a priori knowledge of the contents of the standard cell library or libraries from which they originated. An underlying assumption is that the components did originate from some catalog of pre-designed standard cells (which is typical practice in digital integrated circuit design), that can be stored in the standard cell library database 418. In consequence it is expected that nearly identical copies (modulo optical variations) of the geometric patterns in each physical location where a cell is instantiated will be found.

Figure 5:
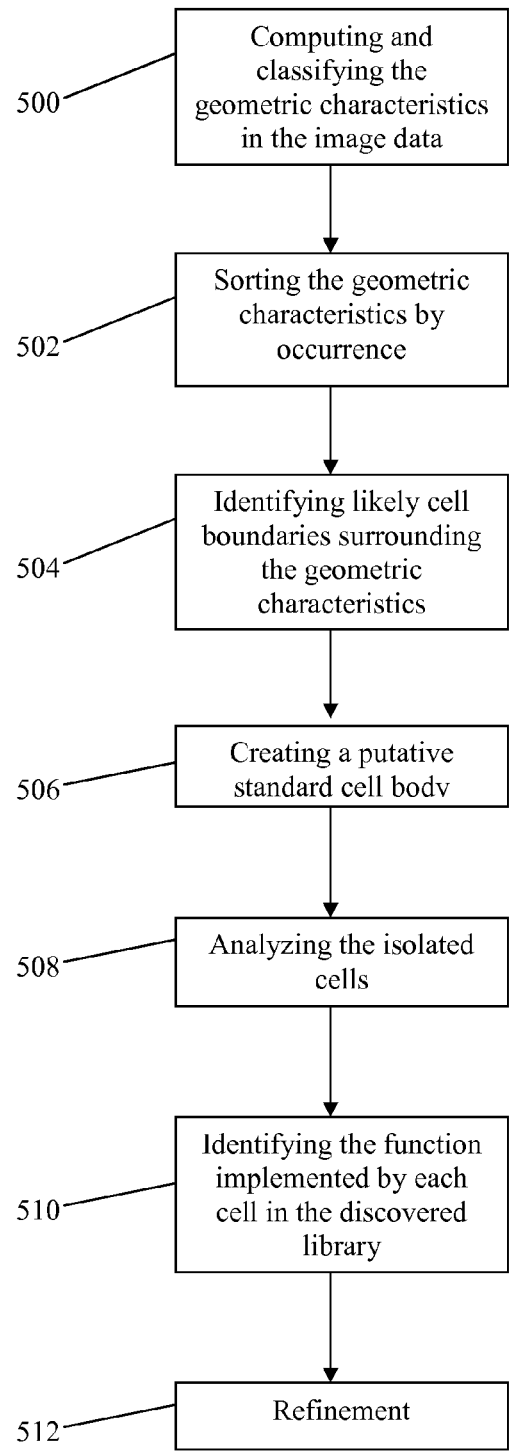
FIG. 5 illustrates an embodiment of a flow diagram of a method for recognizing an unknown library.

As illustrated in FIG. 5, the method of unknown library recognition includes computing and classifying 500 geometric characteristics in the digital image data. The geometric characteristics are computed and classified 500 by transforming the geometric characteristics and/or shapes into sets of numbers. One example of how a geometric characteristic and/or shape can be transformed into a set of numbers is to compute the total length of the median line of a complex shape, which is a shape composed of more than one connected rectangle of the same material type. An example of a complex shape is shown highlighted in FIG. 6A. In FIG. 6B, the outline of this shape is redrawn to illustrate how the (dashed) median line is determined. In addition to computing the length of the median line, one may also compute the number of bends (four for the feature in FIGS. 6A and 6B) and/or the bending number, which represents the number of times the shape turns in a particular direction. The combination of the different invariants that can be computed for a single complex shape constitutes a key that can be used to index the feature in a database.

The term "geometric characteristic" refers to any characteristic of the circuit layout geometry that can serve as a "fingerprint" for a shape, or set of shapes. The exact nature of the geometric characteristic used for classification is not important to the methodology and may be modified as circumstances warrant. For example, when the system is operating from a design database, i.e. with the perfect polygons drawn by a designer, the area or perimeter of the shape may work as a reliable classifier. When the system is operating from image data derived from a fabricated wafer, the geometric characteristics are more likely to be bending moments, number of branches, or other morphological invariants. It should be appreciated that the methods for deriving such geometric characteristics from contiguous groups of pixels are familiar to those skilled in the field of image analysis.

Figure 6A:
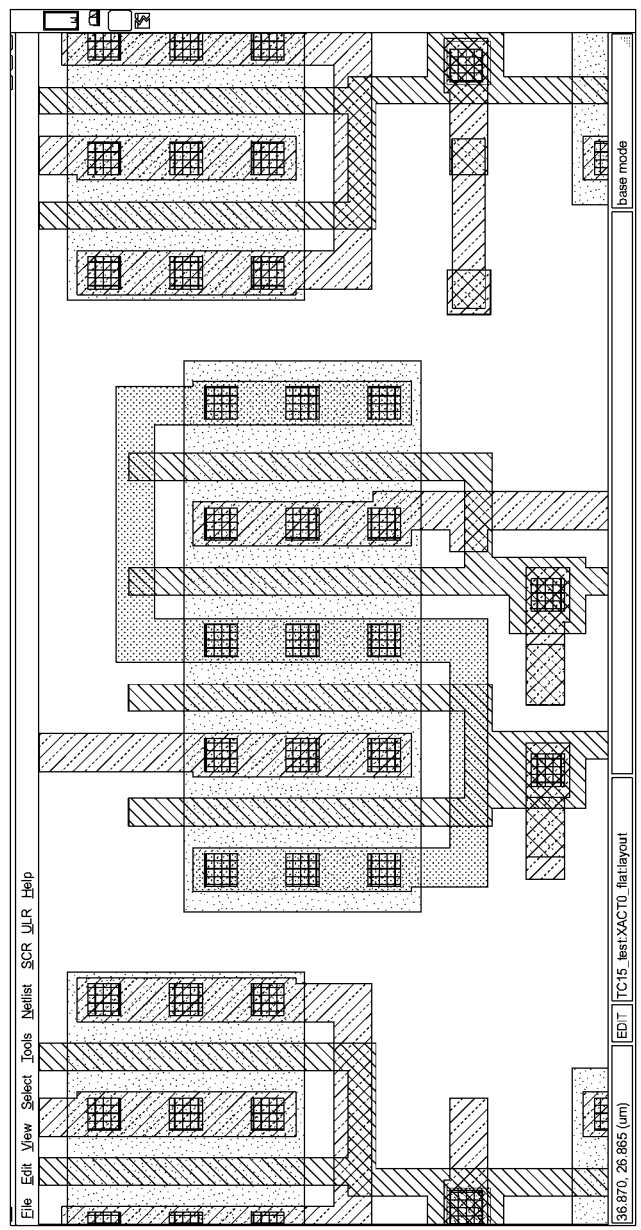
FIG. 6A illustrates an embodiment of an image of a geometric characteristic of a metal shape.
Figure 6B:
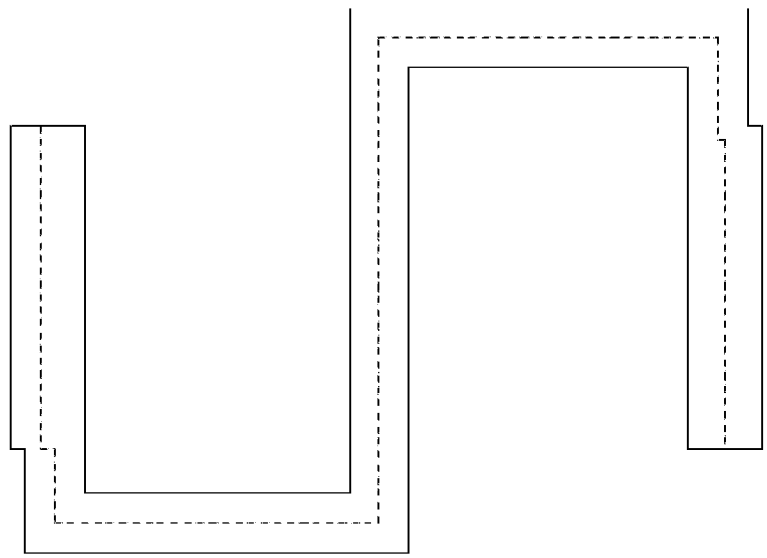
FIG. 6B illustrates a highlighted shape from FIG. 6A illustrating a (dashed) median line.
Figure 7:
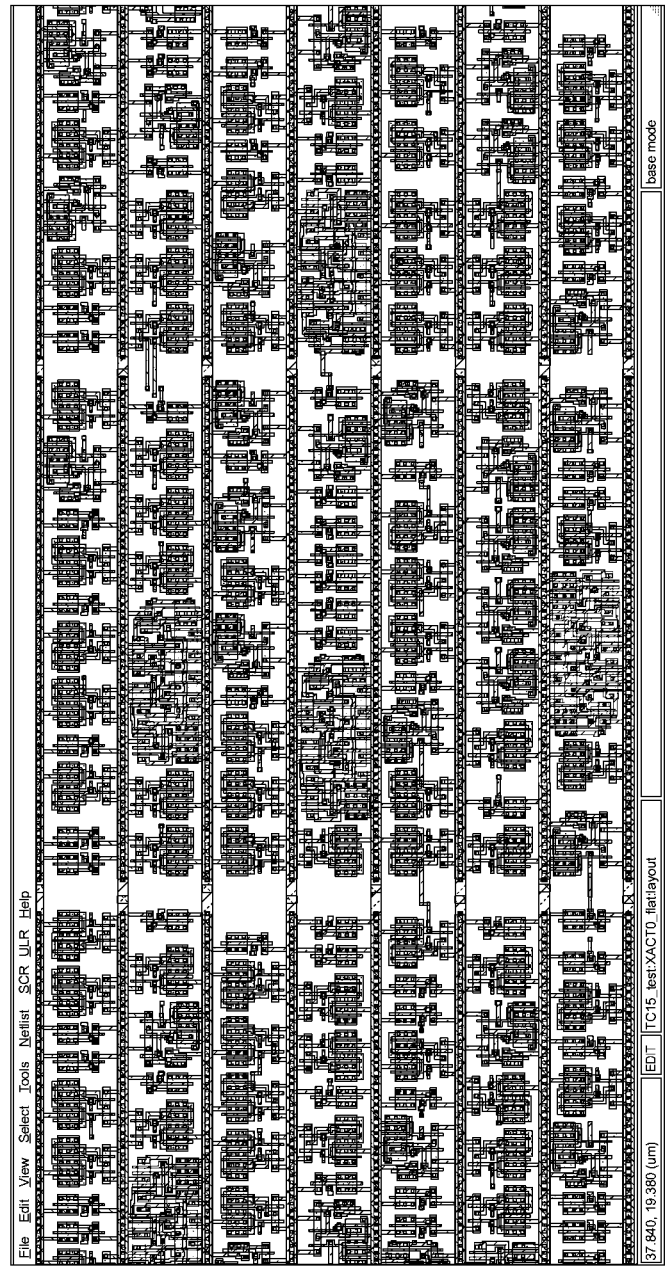
FIG. 7 illustrates an embodiment of an image of multiple occurrences of the geometric characteristic of the metal shape in a layout.

For the complex shape shown in FIG. 6A, an image of multiple occurrences of other shapes demonstrating the same, or similar, computed characteristics in a layout according to an embodiment is illustrated in FIG. 7. Referring to FIGS. 5-7, once the geometric characteristics, such as those illustrated in FIGS. 6A and 6B, are computed and classified 500, the system builds an index of the geometric characteristics. The index allows the system to order the geometric characteristics by their frequency of occurrence 502, as well as to permit rapid table lookup, using the numerical values assigned to the characteristics as a key.

Referring back to FIG. 5, the system then identifies 504 likely cell boundaries surrounding the geometric characteristics. Using the created index, the system starts with the most common geometric characteristics and identifies their locations in the integrated circuit or design. The system then looks for nearby geometric characteristics that co-appear in the same relative positions among the occurrences. Proceeding in this manner, the system obtains a maximal set of geometric characteristics that appear in the same arrangement in multiple areas of the integrated circuit. From this maximal set the system forms an initial boundary for a potential cell to be recognized.

Figure 8:
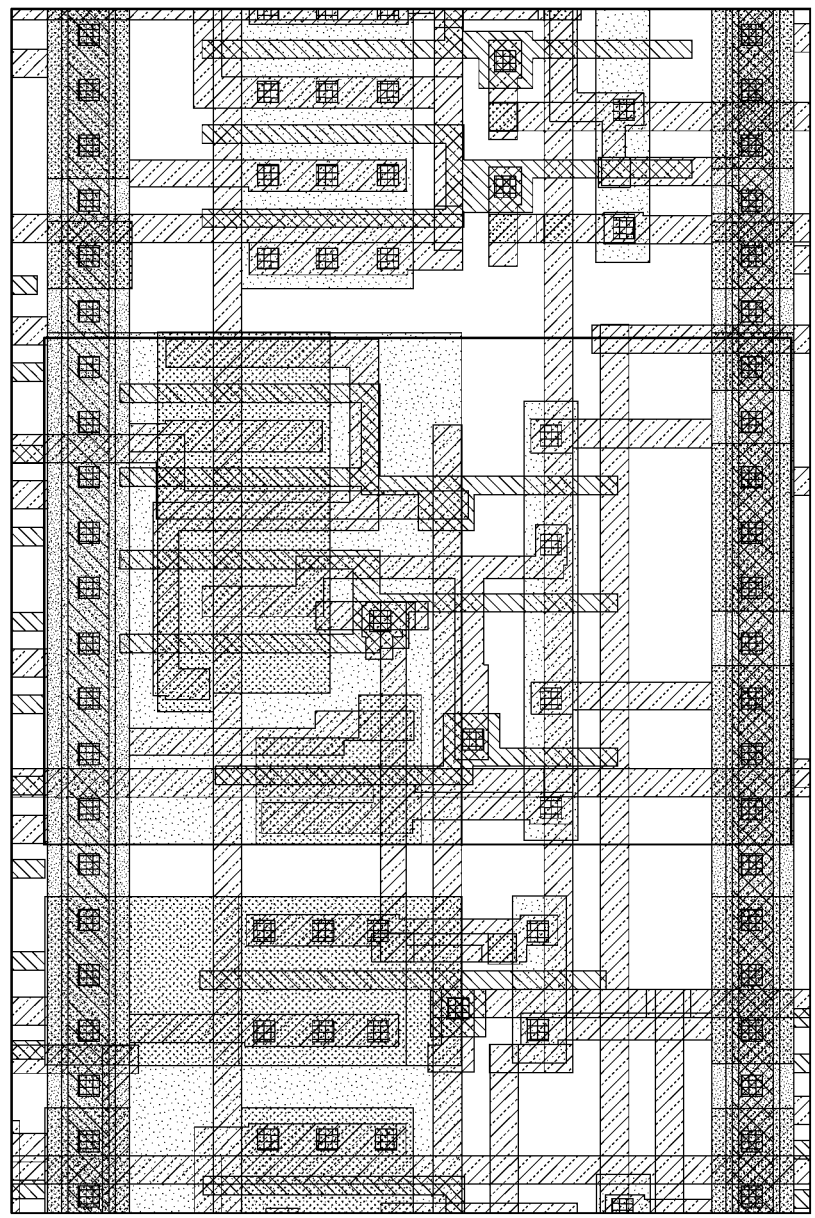
FIG. 8 illustrates an embodiment of an image of an identified cell boundary.

To complete the standard cell from the set of co-occurring geometric characteristics, the system determines a boundary of the cell and creates 506 a putative standard cell body. At this point some process-specific domain knowledge may be invoked, which can be encoded in a variety of parameterized forms. For instance, as illustrated in FIG. 8, it may be the case that cells are all of the same height and that they are placed on a regularly spaced grid that supplies power and ground. In this case, the top and bottom of the cell are determined by finding the power rails. The left and right sides of the cell are found by identifying the lateral extent of transistor bodies. For example, in the layout data illustrated in FIG. 8, which is from an original design database and not from imaging an already fabricated wafer, the transistor bodies are easily identified because the polysilicon and diffusion layers are clearly defined. Using image data, the system uses the presence of short vertical lines of metal, which are used to connect the transistor terminals to the power rails, to indicate the edges of the transistor bodies.

Figure 1:
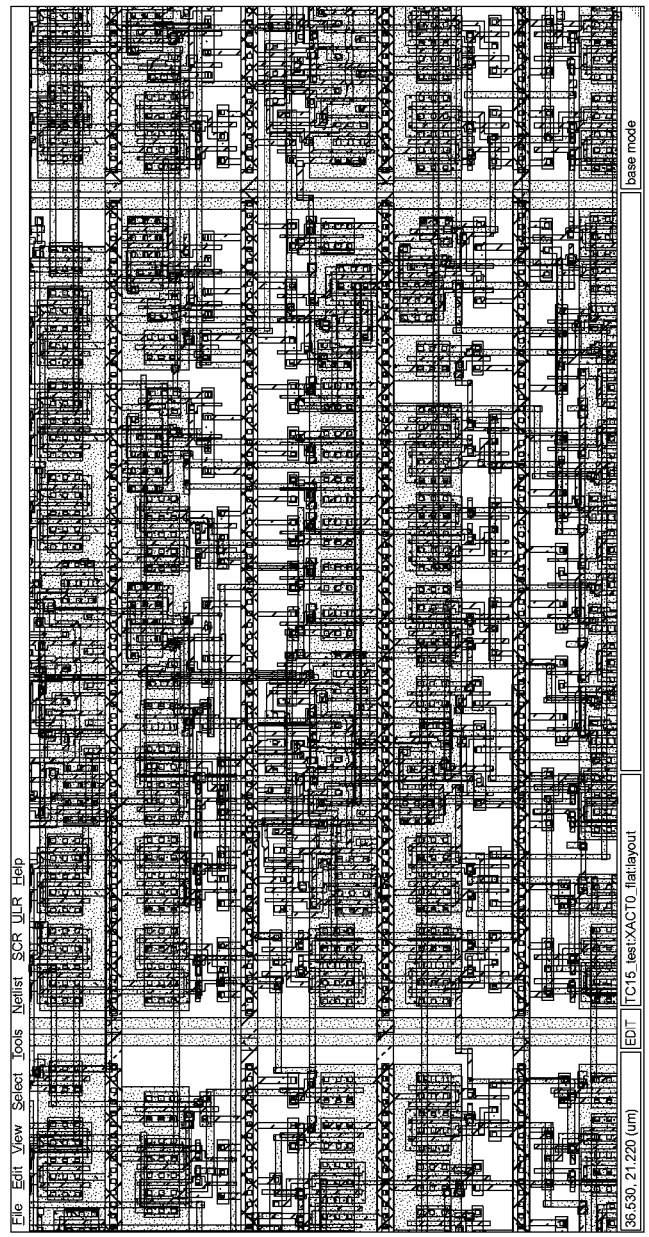
FIG. 1 illustrates an embodiment of an image of a "flat" GDSII file, as known in the art.
Figure 2:
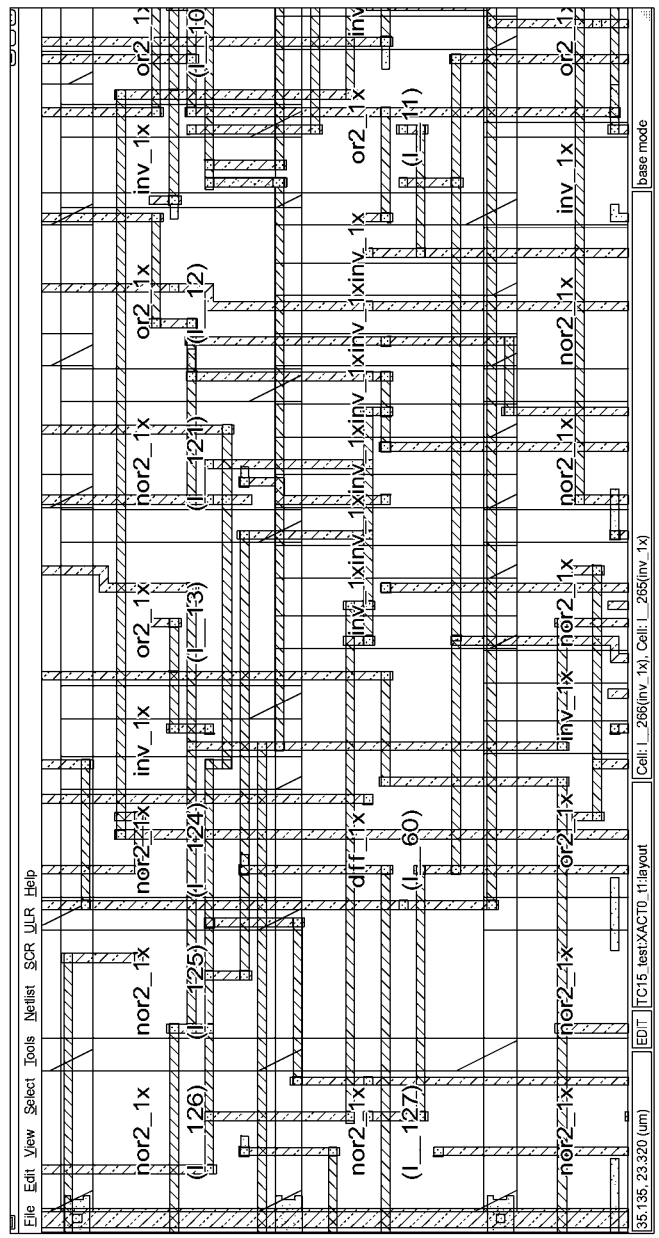
FIG. 2 illustrates an embodiment of an image of a "hierarchical" GDSII file, as known in the art.
Figure 3:
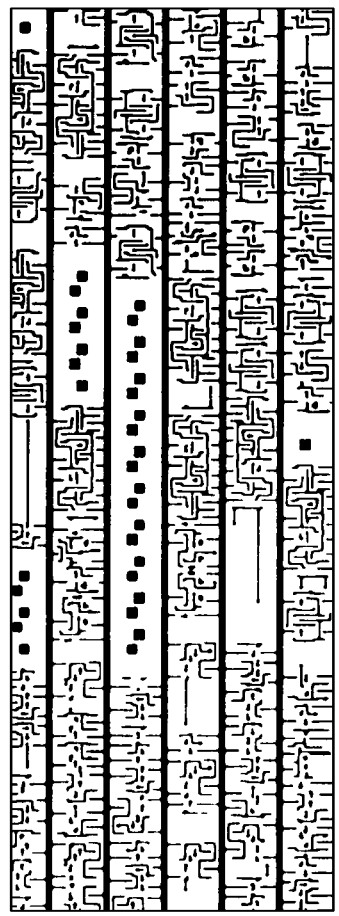
FIG. 3 illustrates an embodiment of an image of a portion of a first metal layer of a fabricated digital circuit, as known in the art.

The domain knowledge, or "expert information," can be encoded as a set of rules in a configuration file to guide the process of carving out the single entity that comprises a standard cell. Such rules should typically be known to one skilled in the art. For example, in CMOS designs the gate widths of the pmos transistors are typically greater than those of the nmos transistors. Thus one can use this knowledge to identify which side of the cell corresponds to the power or ground rail. Also, one skilled in the art will know, or can determine by direct observation, the preferred direction of the metal routing layers. With reference to FIG. 2, where the interconnect routing is clearly visible due to the contents of the standard cells being hidden, one can see that the metal lines run criss-crossed in perpendicular directions. In the example shown in FIG. 2, the even metal layers 2, 4, 6, etc., run vertically, while the odd metal layers 3, 5, etc, run horizontally. Metal layer 1, which is used both inside and outside standard cells, only runs horizontally when used outside the cell, while inside the cell it may run in either direction.

Referring again to FIG. 5, once the standard cell body is created, the system analyzes the isolated cells. It will frequently be the case that some cells, even if taken from a standard library, may only be instantiated once or twice within a large area of a die. This is one reason why the system sorts the geometric characteristics by occurrence, illustrated as 502. The most commonly used cells are recognized first. Afterwards, the cell bodies of the singletons can be extracted by default.

Having isolated the shapes that belong to a given cell, the system identifies 510 the function implemented by each cell in the discovered library. The system identifies 510 the function by finding a cell's active devices, such as but not limited to, transistors, and electrical nets. A transistor-level netlist can then be extracted using known procedures commonly found in many integrated circuit design tools. This netlist can be reduced to canonical form and tested for equivalence to a catalog of known functions such as AND2, NOR2, XOR3, etc. The procedure is straightforward if the layout data is complete. In the case where only partial data is available, such as when the integrated circuit has been imaged, it is necessary to infer the type (nfet/pfet) of the transistors in the cell. It should be appreciated that nothing in the procedure is restricted to digital logic gates only. The system could build a library of analog cells as well.

All library cells may not be identified correctly in one pass. Reasons for misidentification can include missing a contact or a wire, breaking a single cell in two, or combining several cells into one. It may also be the case that the cell implements a function that has not previously been seen and does not exist in the catalog of known functions. Thus, the system can perform a refinement step 512. The refinement step 512 permits a human user to intervene to disambiguate or repair the reasons for mis-identification of the cell.

After the elementary circuit components have been identified and gathered into the library, the next phase of the analysis is to instantiate the cells within the layout and extract the netlist including those components. The system recognizes standard cells (also referred to herein as "Standard Cell Recognition"), by identifying the shapes and polygons within an integrated circuit layout that originated from standard cells in a known library, which may include specifying a name of its supplier. The library may be known by virtue of the foundry or fabrication process used. As one example, users of IBM's 90 nm low power CMOS process may use an Artisan standard cell library. Whether the library was discovered through the previous step of Unknown Library Recognition, or whether it was provided independently, the system validates that the layout represented in the design database is indeed characterized by instances of the standard cell library and that changes have not been made to alter any portions of the components, such as by adding or removing devices or interconnections.

Figure 9:
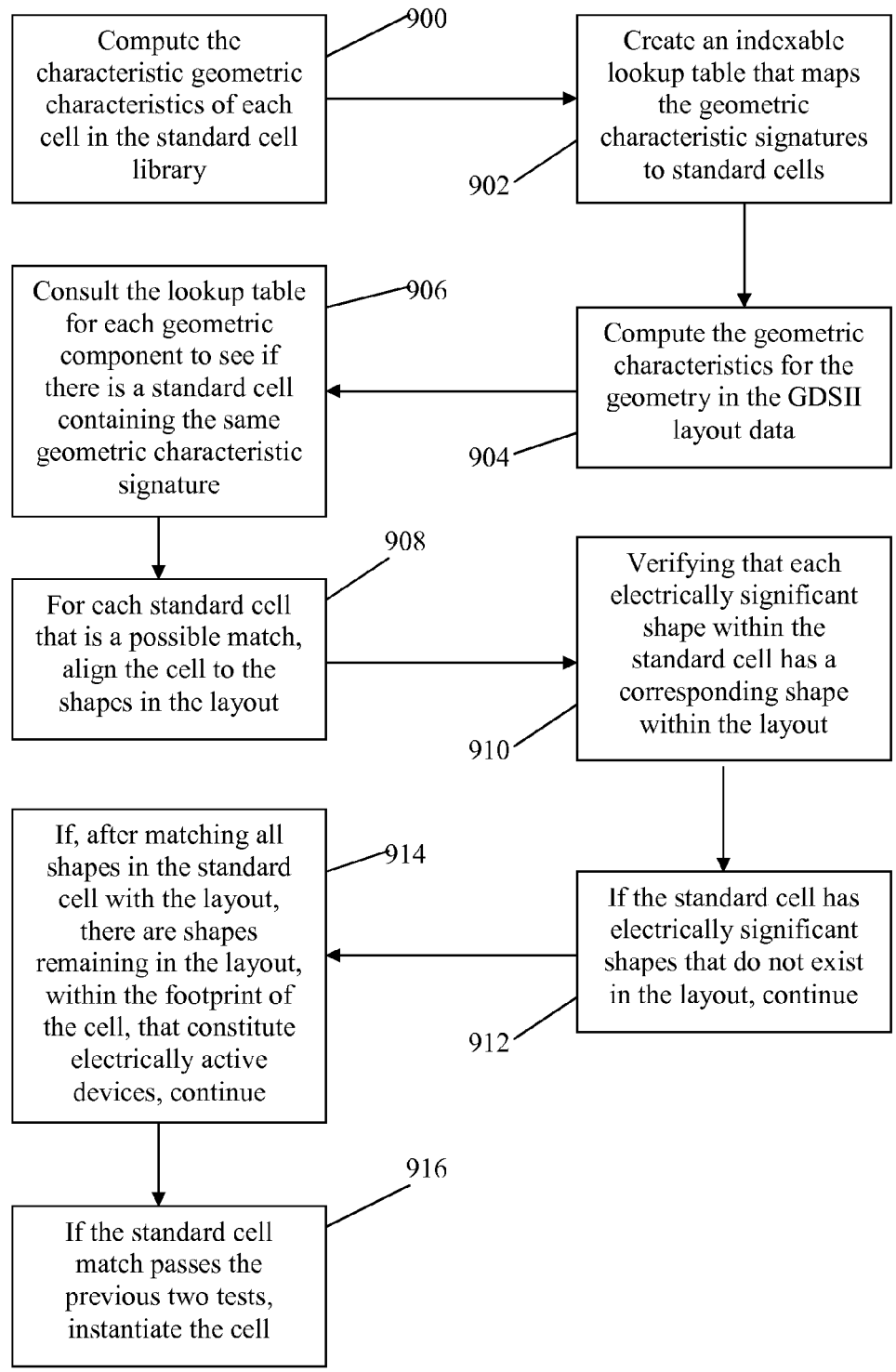
FIG. 9 illustrates an embodiment of a flow diagram of a method for instantiating a standard cell.

A flow diagram of a method for instantiating a standard cell according to an illustrative embodiment is described with reference to FIG. 9. As illustrated in FIG. 9, the system computes 900 the characteristic geometric characteristics of each cell in the standard cell library, as described herein before, and creates 902 an indexable lookup table that maps the geometric characteristic signatures to standard cells. The system then computes 904 the geometric characteristics for the geometry in the GDSII layout data. Each group of polygons constituting a connected component can be used for computing geometric characteristics. As previously described, the computed characteristics of the shapes in each cell in the standard cell library constitutes a numerical key that can be used as an index to a lookup table. For each geometric component in the GDSII layout data the system consults 906 the lookup table and can determine if any standard cell contains a set of shapes that produces the same geometric characteristic signature. If there is not a standard cell containing the same geometric characteristic signature the system continues to the next geometric component. For each standard cell that is a possible match, the system aligns 908 the cell to the shapes in the layout, keying on the matching geometric characteristics as a guide.

Figure 10:
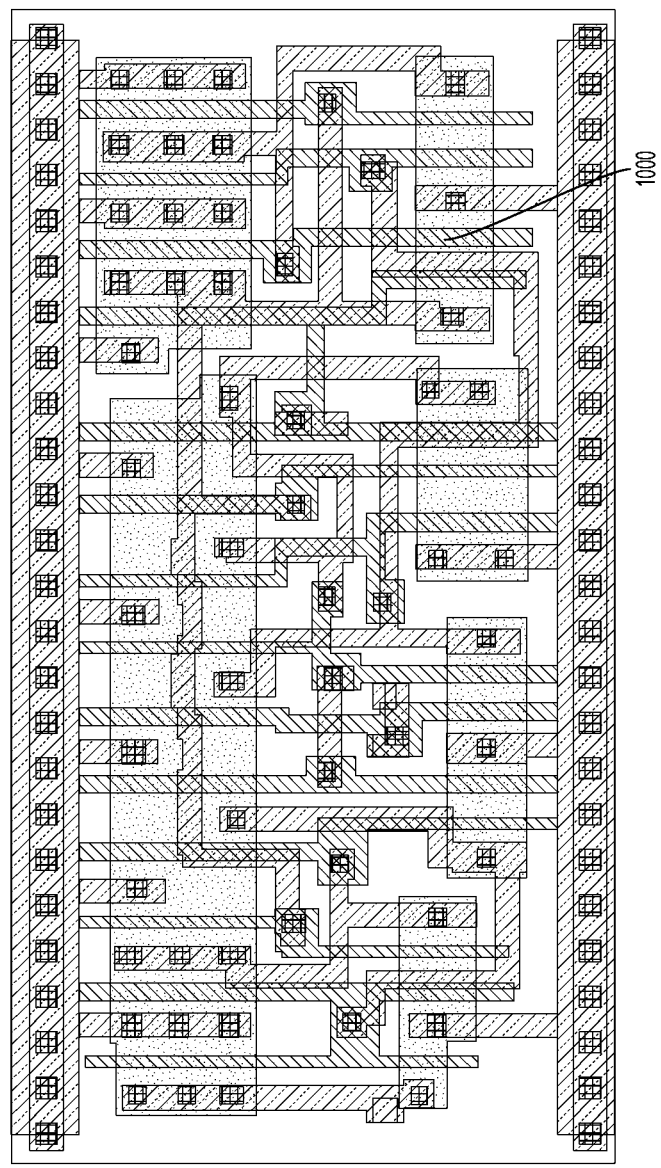
FIG. 10 illustrates an embodiment of a standard cell.
Figure 11:
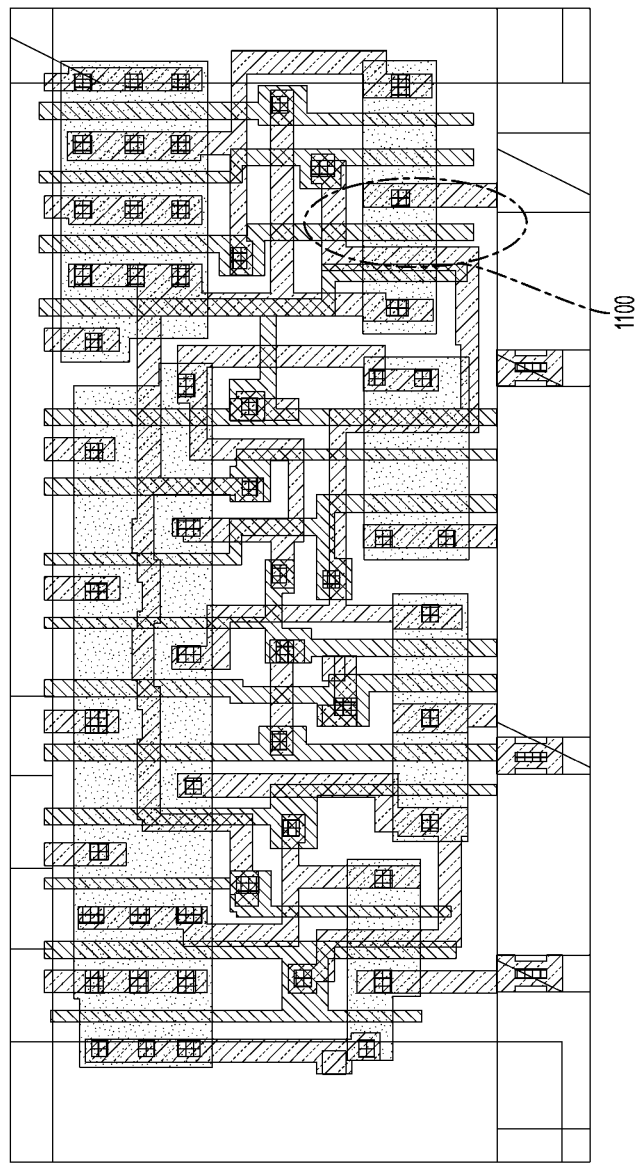
FIG. 11 illustrates an embodiment of an instance of a non-matching standard cell.

The system then verifies 910 that each electrically significant shape within the standard cell has a corresponding shape within the layout. The system temporarily removes these shapes from the layout. If the standard cell has electrically significant shapes that do not exist in the layout, this is not a correct match and the system continues to the next geometric component, illustrated as 912. If, after matching all shapes in the standard cell with the layout, there are shapes remaining in the layout, within the footprint of the cell, that constitute electrically active devices, this is not a correct match and the system continues to the next geometric component, illustrated as 914. An illustrative example of a match failure is illustrated in FIGS. 10 and 11. As illustrated in FIGS. 10 and 11, the standard cell illustrated in FIG. 10 fails to be instantiated at locations 1000 and 1100 illustrated in FIG. 11, despite the fact that over 90% of the shapes align exactly, because a single polysilicon gate has been removed.

Referring back to FIG. 9, if the standard cell match passes the previous two tests, i.e. the standard cell does not have electrically significant shapes that do not exist in the layout and all shapes in the standard cell match with the layout, the system removes the corresponding geometry from the layout and places an instance of the cell, illustrated as 916. After replacing all geometry in the layout that can be replaced with standard cells from the library, the gate-level netlist can be extracted in a straightforward manner. As should be known to those skilled in the art, the connectivity rules for different conducting layers are readily available or can be easily determined. In extracting the physical netlist, one identifies all shapes that are electrically connected by virtue of their disposition in the layout as touching or overlapping. All shapes that are electrically equivalent are assigned to a single net, which is given a unique identifier. Similarly, it is straightforward to identify the connections of top-level metal shapes to the physical input/output terminals of the standard cells instantiated in the layout. The resulting set of net identifiers and their manner of connecting to the standard cells is referred to as a netlist and can be expressed in several formats, one of the more common of which uses the Verilog standard. An example excerpt from a gate-level Verilog netlist is illustrated in FIG. 12.

While the systems and methods have been described and illustrated in connection with certain embodiments, many variations and modifications will be evident to those skilled in the art and may be made without departing from the spirit and scope of the disclosure. The systems and methods disclosed herein are thus not to be limited to the precise details of methodology or construction set forth above as such variations and modification are intended to be included within the scope of the disclosure.

What is claimed is:

1. A method for identifying circuit components of an integrated circuit comprising:
   identifying, by at least one server computer, geometric characteristics of the integrated circuit;
   sorting, by the at least one server computer, the geometric characteristics by order of occurrence;
   identifying, by the at least one server computer, a set of the geometric characteristics that occurs more than once and in a same arrangement;
   determining, by the at least one server computer, a cell boundary based on the set of the geometric characteristics;
   computing, by the at least one server computer, a numerical key for the geometric characteristics;
   looking up in a database, by the at least one server computer, a known cell having geometric characteristics corresponding to the numerical key;
   aligning, by the at least one server computer, the geometric characteristics within the cell boundary with the geometric characteristics of the known cell;
   comparing, by the at least one server computer, each electrically significant geometric characteristic corresponding to an electrically active device within the cell boundary with each electrically significant geometric characteristic corresponding to an electrically active device of the known cell; and
   determining, by the at least one server computer, whether the known cell matches the geometric characteristics within the cell boundary.

2. The method of claim 1, further comprising extracting, by the at least one server computer, a gate-level netlist of the integrated circuit when the known cell matches the geometric characteristics within the cell boundary.

3. The method of claim 1, further comprising creating, by the at least one server computer, an index of the numerical keys corresponding to the geometric characteristics.

4. The method of claim 1, wherein the computing of the numerical key for the geometric characteristics includes computing, by the at least one server computer, a length of the geometric characteristics.

5. The method of claim 1, wherein the computing of the numerical key for the geometric characteristics includes computing, by the at least one server computer, a number of bends of the geometric characteristics.

6. A method for identifying circuit components of an integrated circuit comprising the steps of:
   using at least one server computer to collect image data of an area of the integrated circuit;
   analyzing the image data to determine a set of elementary circuit components;
   determining a cell boundary in the area of the integrated circuit by identifying the set of elementary circuit components that appears more than once and in a same arrangement in the image data;
   identifying electrical components within the cell boundary;
   determining a function of the electrical components within the cell boundary by matching the electrical components within the cell boundary to known electrical components by:
      computing a characteristic numerical key for at least one of the set of elementary circuit components;
      using the characteristic numerical key as an index to a database;
      determining from the database if any database entry contains the characteristic numerical key; and
      matching the database entry containing the characteristic numerical key to the pre-designed integrated circuit cell;
   aligning the pre-designed integrated circuit cell with the image data of the area of the integrated circuit using the at least one of the set of elementary circuit components as a guide within the cell boundary; and
   determining whether each electrical component of the pre-designed integrated circuit cell corresponds to a layout geometry of the area of the integrated circuit within the cell boundary.

7. The method of claim 6, wherein the step of using the characteristic numerical key as the index to the database includes looking up the characteristic numerical key in a lookup table of characteristics of pre-designed integrated circuit cells.

8. The method of claim 6, wherein the step of analyzing the image data to determine the set of elementary circuit components includes determining the set elementary circuit components comprising at least one of a shape, a line length, a number of bends, a number of branches, a component on a conducting layer, and connected components on a conducting layer.

9. The method of claim 6, further comprising the steps of: computing characteristics of pre-designed integrated circuit cells; transforming the characteristics into characteristic numerical keys; mapping the characteristic numerical keys to the pre-designed integrated circuit cells; and storing the characteristic numerical keys in the database.

10. The method of claim 6, further comprising the step of extracting a gate-level netlist when each electrical component of the pre-designed integrated circuit cell corresponds to the layout geometry of the area of the integrated circuit.

11. The method of claim 6, further comprising the steps of:
aligning a second pre-designed integrated circuit cell matching a second database entry containing the characteristic numerical key with the image data of the area of the integrated circuit using the elementary circuit component as the guide; and
determining whether each electrical component of the second pre-designed integrated circuit cell corresponds to the layout geometry of the area of the integrated circuit.

12. A system for identifying circuit components of an integrated circuit comprising:
at least one processor configured to:
analyze image data of an area of the integrated circuit to determine a set of elementary circuit components;
determine a cell boundary in the area of the integrated circuit by identifying the set of elementary circuit components that appears more than once and in a same arrangement in the image data;
identify electrical components within the cell boundary;
determine a function of the electrical components within the cell boundary by matching the electrical components within the cell boundary to known electrical components, the at least processor configured to:
compute a characteristic numerical key for at least one of the set of the set of elementary circuit components;
use the characteristic numerical key as an index to a database;
determine from the database if any database entry contains the characteristic numerical key; and
match the database entry containing the characteristic numerical key to the pre-designed integrated circuit cell;
align the pre-designed integrated circuit cell with the image data of the area of the integrated circuit using the at least one of the set of elementary circuit components as a guide within the cell boundary; and
determine whether each electrical component of the pre-designed integrated circuit cell corresponds to a layout geometry of the area of the integrated circuit within the cell boundary.

13. The system of claim 12, wherein the database includes a lookup table of characteristics of pre-designed integrated circuit cells.

14. The system of claim 12, wherein the set elementary circuit components comprises at least one of a shape, a line length, a number of bends, a number of branches, a component on a conducting layer, and connected components on a conducting layer.

15. The system of claim 12, wherein the at least one processor is further configured to compute characteristics of pre-designed integrated circuit cells; transform the characteristics into characteristic numerical keys; map the characteristic numerical keys to the pre-designed integrated circuit cells; and store the characteristic numerical keys in the database.

* * * * *